(12) United States Patent
Lojek

(10) Patent No.: US 7,098,106 B2
(45) Date of Patent: Aug. 29, 2006

(54) METHOD OF MAKING MIRROR IMAGE MEMORY CELL TRANSISTOR PAIRS FEATURING POLY FLOATING SPACERS

(75) Inventor: Bohumil Lojek, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 10/883,159

(22) Filed: Jul. 1, 2004

(65) Prior Publication Data

US 2004/0235305 A1    Nov. 25, 2004

Related U.S. Application Data

(63) Continuation-in-part of application No. 10/423,637, filed on Apr. 25, 2003, now Pat. No. 6,919,242.

(51) Int. Cl.
*H01L 21/336* (2006.01)
*H01L 21/3205* (2006.01)

(52) U.S. Cl. ................... 438/257; 438/593

(58) Field of Classification Search ............ 438/253, 438/254, 257, 398, 593
See application file for complete search history.

(56) References Cited

U.S. PATENT DOCUMENTS

| | | | |
|---|---|---|---|
| 4,814,594 A | 3/1989 | Drexler | 235/487 |
| 4,931,847 A | 6/1990 | Corda | 357/23.5 |
| 5,108,939 A | 4/1992 | Manley et al. | 437/43 |
| 5,796,139 A * | 8/1998 | Fukase | 257/315 |
| 6,074,914 A * | 6/2000 | Ogura | 438/257 |
| 6,190,964 B1 * | 2/2001 | Winters | 438/254 |
| 6,468,863 B1 | 10/2002 | Hsieh et al. | 438/261 |
| 6,479,351 B1 | 11/2002 | Lojek et al. | 438/266 |
| 6,486,032 B1 | 11/2002 | Lin et al. | 438/266 |
| 6,563,733 B1 | 5/2003 | Liu et al. | 365/185.1 |
| 6,597,047 B1 | 7/2003 | Arai et al. | 257/411 |

FOREIGN PATENT DOCUMENTS

| | | |
|---|---|---|
| EP | 11186416 | 12/1997 |
| JP | 11154712 | 6/1999 |

* cited by examiner

*Primary Examiner*—Mary Wilczewski
*Assistant Examiner*—Pamela E Perkins
(74) *Attorney, Agent, or Firm*—Schneck & Schneck; Thomas Schneck

(57) ABSTRACT

By arranging floating spacer and gate non-volatile memory transistors in symmetric pairs, increased chip density may be attained. For each pair of such transistors, the floating gates are laterally aligned with floating spacers appearing on laterally outward edges of each floating gate. At laterally inward edges, the two transistors share a common source electrode. The transistors are independent of each other except for the shared source electrode. Tunnel oxide separated the floating spacer from the floating gate, but both the spacer and the gate are maintained at a common potential, thereby providing dual paths for charge exiting the tunnel oxide, as the charge is propelled by a programming voltage. The pairs of transistors can be aligned in columns with the direction of the columns orthogonal to the direction of the pairs, thereby forming a memory array.

10 Claims, 5 Drawing Sheets

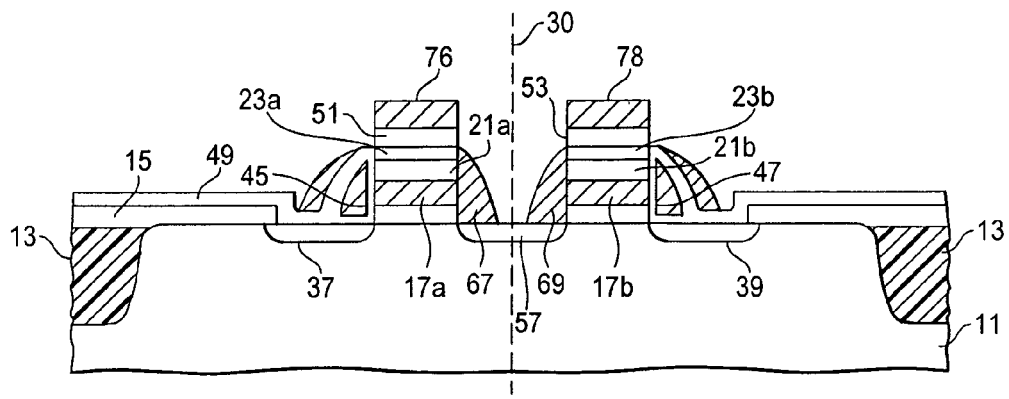
Fig._1
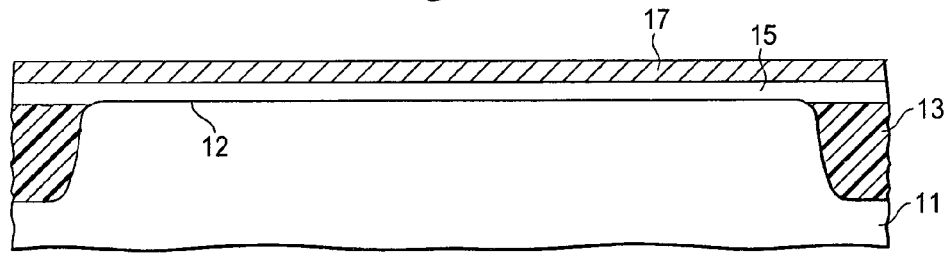
Fig._2
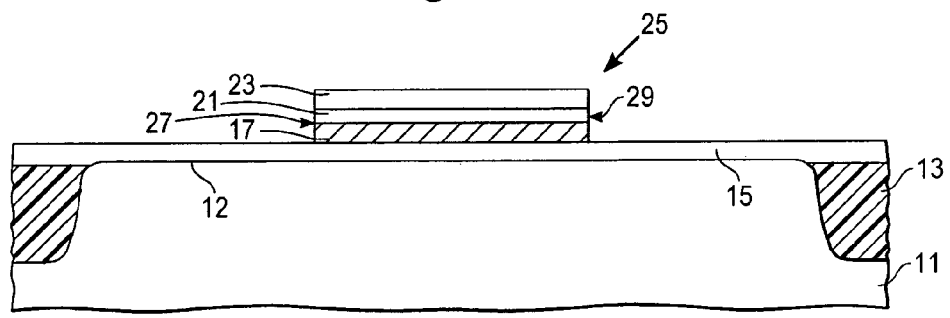
Fig._3
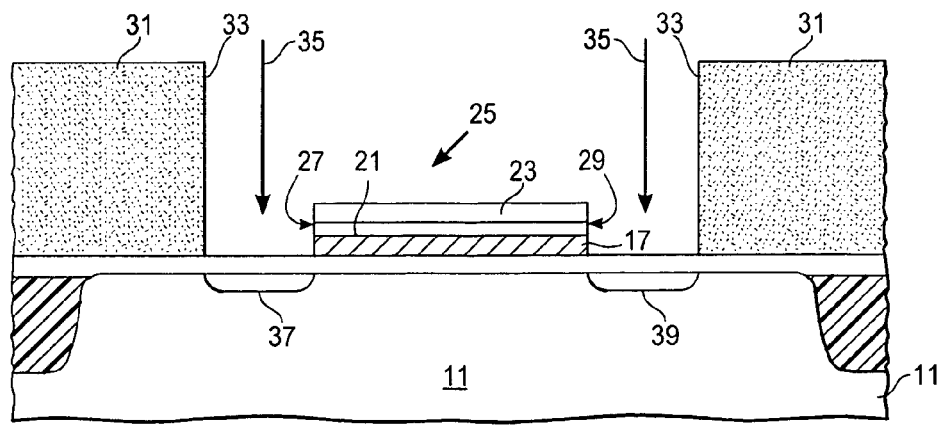
Fig._4

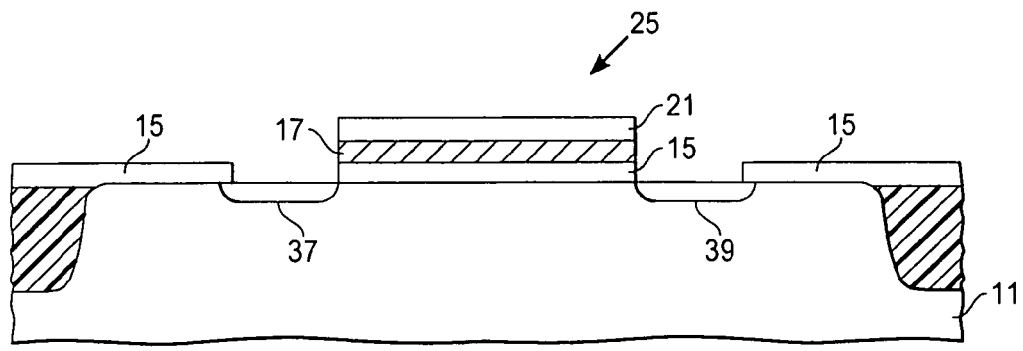
Fig._5
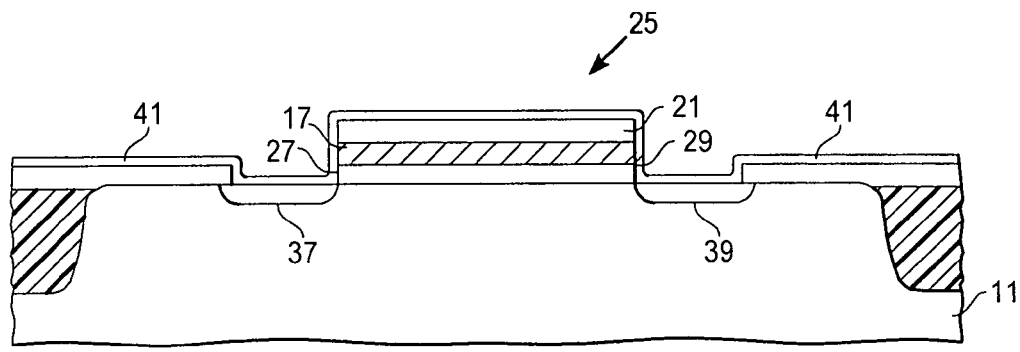
Fig._6
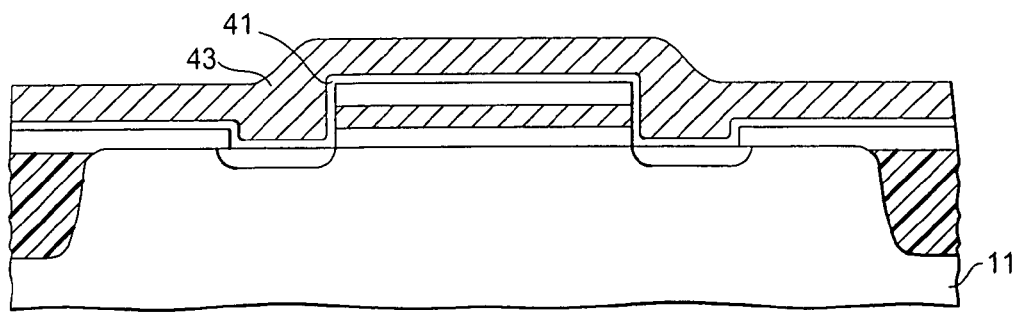
Fig._7

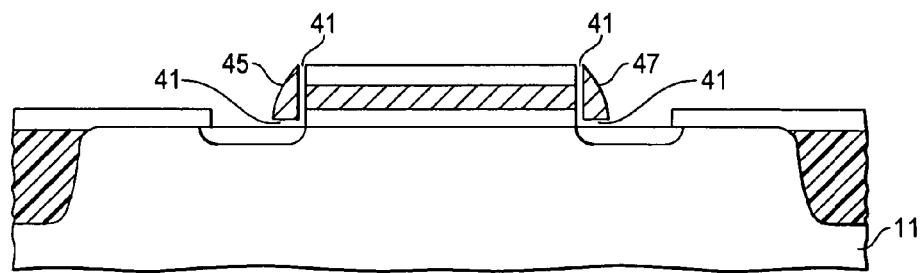
Fig._8
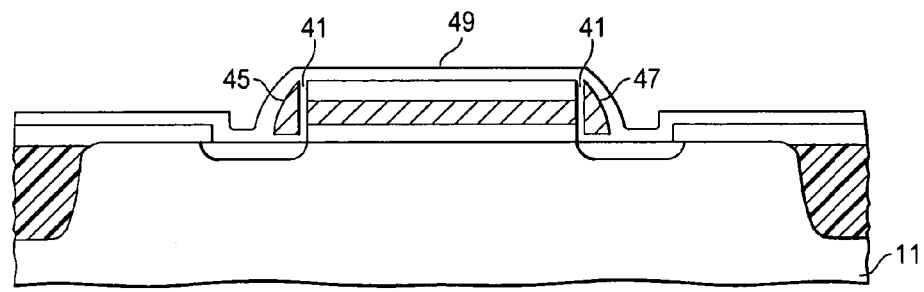
Fig._9
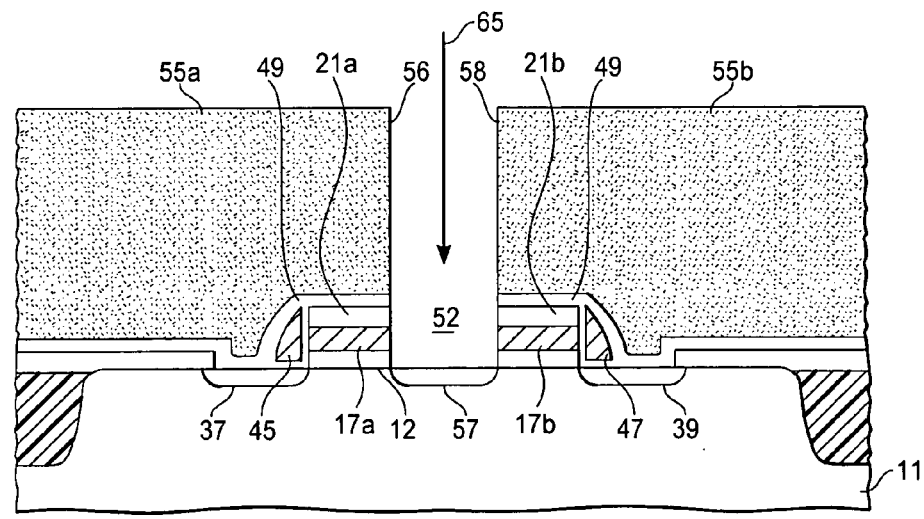
Fig._10

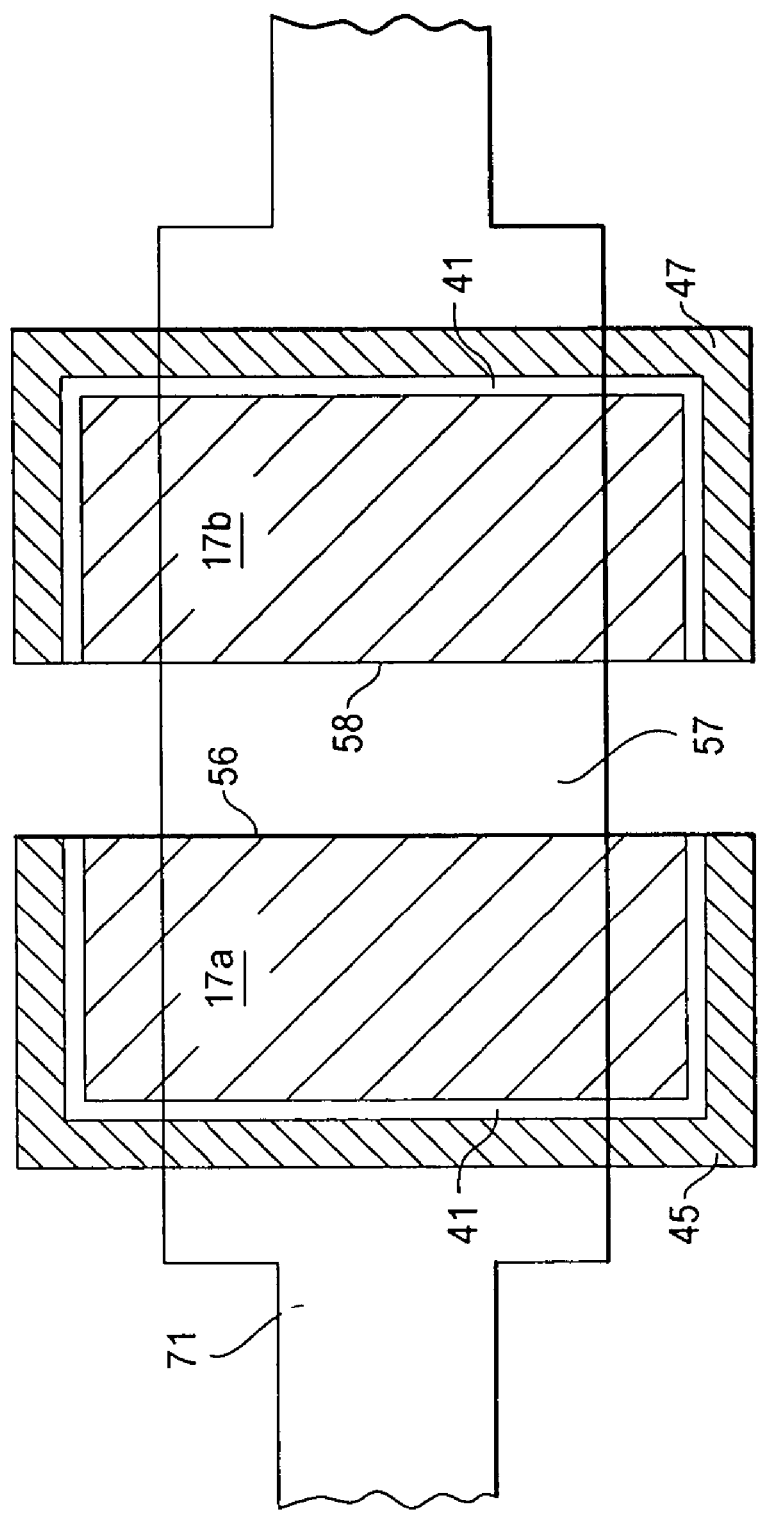

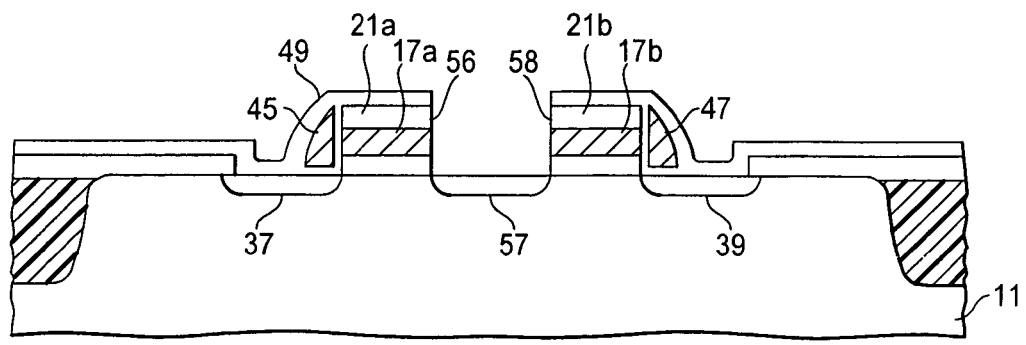
Fig. _12
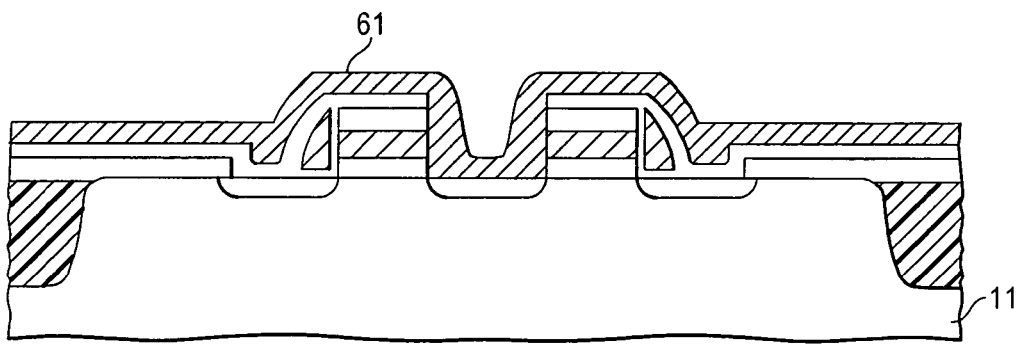
Fig. _13
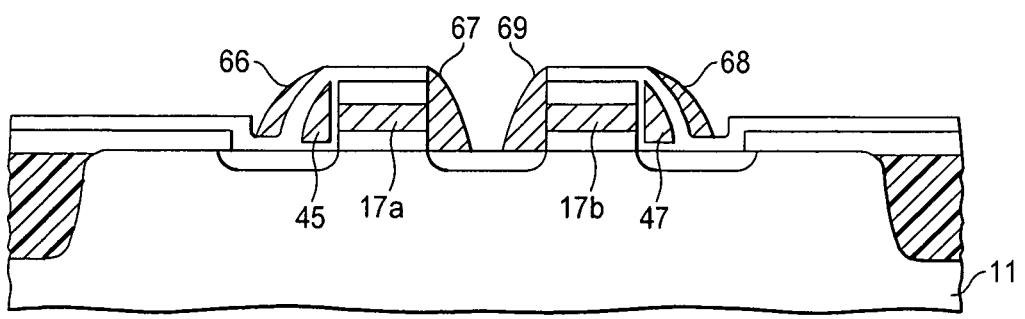
Fig. _14

METHOD OF MAKING MIRROR IMAGE MEMORY CELL TRANSISTOR PAIRS FEATURING POLY FLOATING SPACERS

CROSS REFERENCE TO RELATED APPLICATION

This application is a continuation-in-part of prior application Ser. No. 10/423,637 filed Apr. 25, 2003 now U.S. Pat. No. 6,919,242 for Mirror Image Memory Cell Transistor Pairs Featuring Poly Floating Spacers.

TECHNICAL FIELD

The invention relates to a method of making non-volatile memory transistors for a memory array.

BACKGROUND ART

In U.S. Pat. No. 6,479,351 to Lojek et al., incorporated by reference herein, there is disclosed a self-aligned non-volatile memory cell comprising a small sidewall spacer electrically coupled and being located next to a main floating gate region. Both the small sidewall spacer and the main floating gate region are formed from conductive polysilicon ("poly") on a substrate and both form the floating gate of the non-volatile memory cell. Both are isolated electrically from the substrate by an oxide layer which is thinner between the small sidewall spacer and the substrate and is thicker between the main floating gate region and the substrate. The thin oxide region is thin enough to be an electron tunneling medium, i.e. a pathway for electrons to migrate into the floating gate from a substrate electrode. The thin oxide layer is brought up vertically along a wall of the main floating gate region, separating the main floating gate region from the spacer, allowing charge migrating through the thin oxide to exit in opposite directions, i.e. into the main floating gate body or into the sidewall spacer. Both the main floating gate body and the sidewall spacer are made of polysilicon or poly and are electrically connected so that both have the same electrical potential. A control gate overlying the main floating gate body and the sidewall spacer can draw charge from the substrate into these structures by application of a programming voltage where the charge will remain until an opposite programming voltage causes discharge of the structures.

Japanese Patent Publication No. 11154712 by K. Kenichi of NEC Corp. shows a similar structure.

While the spacer floating gate memory cells disclosed in the '351 patent are very useful, an object of the invention was to devise a way to make spacer floating gate memory cells more compact for use in large scale memory arrays.

SUMMARY OF INVENTION

The above object has been met by constructing a symmetric side-by-side arrangement of memory cells of the type described in the '351 patent, with the two devices sharing a common subsurface electrode that defines a plane of symmetry.

In one embodiment, consider individual pairs of devices fabricated in a semiconductor substrate, with one device to the left and one device to the right of a common central substrate doped region that forms a common electrode for the pair. The two devices are symmetric halves of a poly mesa structure that is divided by a gap so that the common central substrate doped region can be formed in the gap. Each device has at least one sidewall spacer facing an electrically insulated central polysilicon body, i.e. a poly floating gate, with left and right edges that are used for self-aligned placement of subsurface drain electrodes prior to dividing the poly mesa structure and prior to the sidewall spacer formation. The left device has a floating polysilicon spacer separated from the central polysilicon body on the left edge by tunnel oxide and the right device has a floating polysilicon spacer separated from the associated central polysilicon body on the right edge by tunnel oxide. Each memory device has a substrate doped region outwardly adjacent to each polysilicon spacer i.e., a drain electrode in the substrate body. After spacer formation, the poly structure is divided into two halves, with spaced apart sidewall edges defining a gap. The sidewall edges allow self-aligned implantation of a common source electrode. After formation of the common source electrode, each central polysilicon body is electrically connected to the facing polysilicon spacer, allowing charge entering the tunnel oxide separating the two regions to escape by tunneling into either region. The electrical connection between the two regions equalizes the electrical potential of the two regions. The two memory transistors are each capable of independently storing a binary bit of data in the form of charge transferred to and from the floating polysilicon spacers and the central polysilicon body under the influence of a control electrode either storing charge upon, or discharging, a polysilicon spacer and an associated facing polysilicon body.

BRIEF DESCRIPTION OF THE DRAWINGS

FIG. 1 is a side cutaway view of a mostly finished pair of side-by-side floating gate memory cell transistors fabricated in a common substrate in accordance with the present invention.

FIGS. 2–10 are side cutaway views of steps in manufacturing the devices shown in FIG. 1.

FIG. 11 is a top view of the device of FIG. 10 with photoresist removed.

FIGS. 12–14 are further side cutaway views of steps in manufacturing the devices shown in FIG. 1.

BEST MODE FOR CARRYING OUT THE INVENTION

With reference to FIG. 1, a p-type substrate 11 has deep n-well isolation regions 13 as typically used in LOCOS or STI oxidation of silicon. The isolation regions are boundaries that define the active area for memory cell fabrication. Above the substrate is gate oxide layer 15 and polysilicon floating gate members, including left member 17a and right member 17b, both floating gate members above the gate oxide layer 15. Each floating gate member has vertical sidewalls at laterally inward edges, which are very close to each other, i.e. within a few microns, and at laterally outward edges. These vertical sidewalls allow for self-aligned implantation of n-type doped regions in substrate 11 forming subsurface electrodes, namely left drain 37, right drain 39, and a shared source 57. The vertical center line 30 through source 57 forms left and right planes of symmetry for the two memory transistors. The floating gate members 17a and 17b are covered with CVD oxide layer portions 21a and 21b and then by nitride layer portions 23a and 23b.

Left and right polysilicon spacers, 45 and 47 respectively, are floating structures, spaced laterally outwardly from the plane of symmetry, insulated from the floating gates 17a and 17b by a layer of thin oxide, known as tunnel oxide, discussed below, having a thickness ranging between 10 and 50 angstroms. A layer 49 of low temperature oxide, known as LTO, protects the outer and upper surface of the left and right poly spacers 45 and 47.

Laterally surrounding the floating gates 17a and 17b is contacting poly spacers 67 and 69, only visible on the inward sides of the floating gates, electrically joining each of the poly spacers 45 and 47 to the floating gates 17a and 17b, respectively. Because each contacting poly member is conductive, the respective poly spacers and the floating gates are at the same electrical potential.

Above the low temperature oxide (LTO) layer 49 and the poly gates 17a and 17b are oxide-nitride-oxide (ONO) layer portions 51 and 53, respectively, above nitride layer portions 23a and 23b. Above the ONO layer portions are control poly layer portions 56 and 58, respectively, having a thickness comparable to the floating gates 17a and 17b.

In operation, programming signals having a sufficiently high voltage cause electric charge from one of the drains 37 or 39 to tunnel into the floating poly members, poly spacers 45 or 47, as well as the neighboring poly floating gates 17a and 17b respectively for a charge storage operation. Charge tunnels through tunnel oxide 41 from a drain substrate electrode 37 or 39 and has an opportunity to emerge from the tunnel oxide into two contacting surfaces, namely the poly spacer 45 or 47 on the one hand and the corresponding floating gate 17a or 17b on the other hand. It does not make any difference whether the charge goes mainly into one or the other of the two poly members because they are joined by contacting poly member which is the contacting poly spacers 67 and 69, respectively, which equalizes the electrical potential among the two joined poly members. The two joined poly members thus form a single storage site. The increased surface area in contact with the thin oxide means that charge can more readily leave the tunnel oxide through the two poly opposed surfaces, namely a floating gate and a poly spacer that form the single storage site. Charge storage and removal from the floating members becomes faster due to lowered capacitance.

Discharge of the floating members is equally fast under the influence of the control poly layer members 56 and 58, both being in the uppermost poly layer, poly four. These layer members direct charge from the floating members into a contacting poly spacer 67 and 69 and to the common source electrode 57. The layering of each transistor is similar to what is disclosed in U.S. Pat. No. 6,479,351 assigned to the assignee of the present invention. What is new is the simultaneous symmetric construction of pairs of devices with a shared electrode structure. Because the source electrode is shared, erase operations must be phased so that both transistors of the pair do not attempt to erase at the same time.

Construction of the devices is now described. With reference to FIG. 2, p-type substrate 11, or a p-well in an n-type substrate, is seen to have a planar surface 12 which is the upper surface of the substrate. The planar surface 12 exists within active region defined by the shallow trench isolation (STI) zone 13. Upon the planar surface 12, a layer of thermal oxide is grown, known as gate oxide layer 15. This oxide layer has a uniform thickness of approximately 100–300 angstroms (Å) across the planar surface 12. Over the gate oxide layer 15, a polysilicon layer 17, known as poly one, is deposited, approximately 750–1500 Å thick, preferably 1000 Å thick. By a process of masking and etching, a polysilicon mesa structure 25 is to be formed, including a layer of CVD oxide 21, approximately 150 Å and an equally thick nitride layer 23, as shown in FIG. 3.

The mesa structure, shown in FIG. 4, features the poly floating gate 17. The floating gate has a left edge 27 and a right edge 29. The left and right edges are made generally vertical in the masking and etching process. A photoresist layer 31 is shaped to have vertical edges 33. The vertical edges 33 and the vertical edges 27 and 29 of mesa structure 25 allow for ion implantation into substrate 11, indicated by arrows 35. The ion implantation consists of the injection of energetic ions, such as n+ ions, into substrate 11 to form subsurface doped n+ self-aligned regions 37 and 39. The left subsurface implanted region is drain 37. The right subsurface implanted region is drain 39. Drain 37 and drain 39 are associated with a pair of memory cells to be formed by dividing poly mesa structure 25 in a symmetric manner at a subsequent step.

The nitride layer 23, the top layer of poly mesa structure 25, shown in FIG. 3, is now removed, by etching. The gate oxide layer 15 is also etched where not protected, namely over the drain regions 37 and 39, as seen in FIG. 5. Photoresist layer 31 is now stripped, leaving a structure as shown in FIG. 5.

Mesa structure 25 still has a poly one layer 17 sandwiched between gate oxide layer 15 and CVD oxide layer 21. A very thin layer of thermal oxide 41, in the range of 10 Å to 40 Å, is shown in FIG. 6 to be applied over the entire construction site. This oxide layer, known as tunnel oxide, has vertical portions adjacent to vertical edges 27 and 29 of mesa structure 25 and horizontal portions elsewhere.

Next, a conductive poly two layer 43 is disposed over the construction site specifically over tunnel oxide layer 41, as shown in FIG. 7. This polysilicon layer is then dry etched to the point where all of the polysilicon is removed, except for spacers 45 and 47, seen in FIG. 8, which are small polysilicon regions abutting, on the left side, an upright portion of the tunnel oxide and a corresponding upright tunnel oxide portion on the right side. The spacers 45 and 47 are small slivers of polysilicon which remain hidden during the dry etch, with the etch being terminated before the slivers are removed. Note that the poly spacers are floating structures, being isolated from substrate 11 by a tunnel oxide portion immediately below the spacers 45 and 47 and being isolated from the poly floating gate by a vertical portion of tunnel oxide 41. Next, as seen in FIG. 9, a layer of low temperature oxide (LTO) 49 is applied over the construction site.

In FIG. 10, a mask 55a and 55b is applied covering LTO layer 49 as a continuous mask over the entire construction site. However, along a plane of symmetry, an opening 52 is etched extending to surface 12. The opening has vertical sidewalls 56 and 58 that create a self-aligned aperture subsurface for a charged particle beam 65 to create a doped subsurface region 57 that will become a common source electrode for two symmetric transistors. The left device has floating gate 17a and floating spacer 45 both insulated from drain 37 and source 57, while the right device has floating gate 17b and floating spacer 47, both insulated from drain 39 and common source 57. The opening 52 divides the construction site into two floating gate devices. The photoresist is now stripped.

In the top view of FIG. 11, the boundary 71 defines the active area where the mirror image transistor pair is formed. The central area 57 is the common source electrode. Seen through overlying oxide are floating gates 17a and 17b, surrounded on three sides by a vertical wall of tunnel oxide 41 that separates poly spacers 45 and 47 from the respective floating gates 17a and 17b. Note that poly edges 56 and 58 are aligned with edges of the poly spacers 45 and 47. A side view of the same configuration is shown in FIG. 12. This aspect of the invention is illustrated twice, i.e., in both FIGS. 11 and 12, to demonstrate the need for a clean cut to achieve the above-mentioned alignment as a prelude to the next step.

With reference to FIG. 13, a third poly layer 61, i.e., poly three, is deposited over the construction site and then dry etched to form contacting poly spacers 67 and 68 69, seen in FIG. 14, that join the floating spacers 45 and 47 to the respective floating gates 17a and 17b at the poly edges mentioned above. The contacting poly spacers 67 and 69 keep the floating gates and the joined poly spacers at the same electrical potential in each transistor. This joinder is a very important aspect of the present invention. The poly remnants 66 and 68 have no function but remain as part of the etching step that formed the contacting spacers 67 and 69. The two symmetric transistors are completed, as shown in FIG. 1 with a further oxide step, a poly control gate and a protective oxide coating upon the control gate.

In operation, the two non-volatile memory transistors operate semi-independently. Each transistor can store one binary bit but because the source electrode is shared for discharge, only one transistor at a time can be erased by phasing the erase operation, except in block erase mode where both transistors can be erased at the same time by allowing the common source to receive stored charge from both transistors simultaneously. In the write mode, charge is stored within a floating gate and associated poly spacer when a control gate induces electron tunneling from a nearby drain electrode onto the floating members. The very compact arrangement of two memory transistors allows use of low voltages for programming and erasing.

The invention claimed is:

1. A method of making mirror image non-volatile memory transistor pairs comprising:
   building a pair of spaced apart poly floating gate structures in a isolation region of a semiconductor substrate having a surface upon which said structures are built with a gap therebetween, each structure spaced from the substrate by tunnel oxide and having opposed sidewalls on opposite sides thereof;
   forming a pair of first subsurface electrodes adjacent sidewalls of the floating gate structures;
   disposing a first poly spacer spaced apart by tunnel oxide to a sidewall of each floating gate structure;
   after formation of the first poly spacers, forming a second subsurface electrode between the first subsurface electrodes;
   forming a second poly spacer in electrically contacting relation relative to a sidewall of each floating gate structure and electrically joined to a respective first poly spacer, the second poly spacer in contact relation joining a floating gate structure and a first poly spacer;
   forming a control gate in insulative relation over each floating gate structure.

2. The method of claim 1 wherein the pair of spaced apart floating gate structures are formed by dividing a single poly mesa structure with opposed lateral sides above the substrate and electrically insulated from the substrate.

3. A method of making mirror image non-volatile memory transistor pairs comprising:
   providing a doped semiconductor substrate with an upper surface within an isolation region, with a gate oxide layer and a first poly layer thereon;
   forming a poly mesa structure with opposed lateral sides within the isolation region above the substrate and insulated therefrom, the structure including a poly floating gate formed from the gate oxide layer and the first poly layer;
   using the opposed lateral sides of the mesa structure for self aligned placement of subsurface implanted regions forming first and second spaced apart drain electrodes;
   exposing portions of the implanted regions within opposed lateral sides of the mesa;
   depositing tunnel oxide over exposed portions of the implanted regions and over opposed lateral sides of the mesa structure;
   depositing a second poly layer over the isolation region, including over and the tunnel oxide;
   etching the second poly layer leaving a pair of poly spacers on opposed lateral sides of the mesa structure;
   depositing an insulative layer over the isolation region;
   etching a gap in the mesa structure between the poly spacers, thereby forming two mesa substructures each with a poly floating gate, and implanting ions into the substrate below the gap thereby forming a source electrode;
   depositing a third poly layer over the insulative layer;
   etching the third poly layer leaving a pair of contact spacers, each contact spacer electrically joining a poly spacer and a poly floating gate of a mesa substructure; and
   depositing a fourth poly layer over the mesa substructures and etching the fourth poly layer to form control gates above the floating gates of the mesa substructures.

4. The method of claim 3 further defined by forming the isolation region as a linear stripe.

5. The method of claim 3 wherein exposing of portions of the implanted regions within opposed lateral sides of the mesa is by etching at least portions of the gate oxide layer over the first and second spaced apart drain electrodes.

6. A method of making mirror image non-volatile memory transistor pairs comprising:
   building a mesa structure with opposed sidewalls in an isolation region of a semiconductor substrate having a surface of upon which said structure is built, the mesa structure having a poly floating gate;
   using the opposed sidewalls of the mesa structure for self aligned ion implantation of first subsurface electrodes in the substrate;
   disposing first poly spacers in insulated relation relative to opposed side walls of the mesa structure;
   etching a gap in the mesa structure, thereby dividing the mesa structure into two mesa substructures each with a poly floating gate, with exposed edges facing the gap;
   implanting a second subsurface electrode through the gap into the substrate, the subsurface electrode being a common electrode for each of the two mesa substructures;
   forming a pair of contact spacers, each contact spacer electrically joining a first poly spacer and a poly floating gate of each mesa substructure; and
   forming control gates above the floating gates of the mesa substructures.

7. The method of claim 6 further defined by making the first poly spacers from a single layer of poly two prior to forming contact spacers.

8. The method of claim 6 further defined by making the poly floating gate from a single layer of poly one.

9. The method of claim 6 wherein a plane of symmetry passes through the subsurface electrode.

10. The method of claim 6 further defined by making the contact spacers from a single layer of poly three.

* * * * *